United States Patent
He et al.

(10) Patent No.: US 11,309,528 B2
(45) Date of Patent: Apr. 19, 2022

(54) FLEXIBLE DISPLAY PANEL AND FABRICATING METHOD THEREOF, FLEXIBLE DISPLAY APPARATUS

(71) Applicant: BOE TECHNOLOGY GROUP CO., LTD., Beijing (CN)

(72) Inventors: Wei He, Beijing (CN); Huili Wu, Beijing (CN); Shipei Li, Beijing (CN); Dongsheng Li, Beijing (CN); Fang He, Beijing (CN); Renquan Gu, Beijing (CN); Sheng Xu, Beijing (CN); Dongsheng Yin, Beijing (CN); Wusheng Li, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 16/769,374

(22) PCT Filed: Oct. 8, 2019

(86) PCT No.: PCT/CN2019/109939
§ 371 (c)(1),
(2) Date: Jun. 3, 2020

(87) PCT Pub. No.: WO2020/192079
PCT Pub. Date: Oct. 1, 2020

(65) Prior Publication Data
US 2021/0234137 A1    Jul. 29, 2021

(30) Foreign Application Priority Data

Mar. 28, 2019    (CN) .......................... 201910243047.3

(51) Int. Cl.
*H01L 51/56*        (2006.01)
*H01L 51/00*        (2006.01)
*H01L 27/32*        (2006.01)

(52) U.S. Cl.
CPC .......... *H01L 51/56* (2013.01); *H01L 51/0097* (2013.01); *H01L 27/3244* (2013.01);
(Continued)

(58) Field of Classification Search
None
See application file for complete search history.

(56) References Cited

U.S. PATENT DOCUMENTS 7,172,950 B2     2/2007 Takezoe et al.
2016/0329268 A1*  11/2016 Howard .............. H01L 21/4853

FOREIGN PATENT DOCUMENTS

CN    103540269 A      1/2014
CN    106887407 A  *   6/2017
(Continued)

OTHER PUBLICATIONS

Machine translation of CN-106887407-A (Year: 2017).*
(Continued)

*Primary Examiner* — J. E. Schoenholtz
(74) *Attorney, Agent, or Firm* — WHDA, LLP

(57) ABSTRACT

The present disclosure relates to a method of fabricating a flexible display panel. The method of fabricating the flexible display panel may include forming a photosensitive layer comprising at least one azo group on a carrier substrate; forming a flexible substrate on the photosensitive layer; irradiating the photosensitive layer with ultraviolet light; and peeling off the flexible substrate from the carrier substrate.

13 Claims, 4 Drawing Sheets

(52) U.S. Cl.
CPC .. *H01L 2227/323* (2013.01); *H01L 2227/326* (2013.01); *H01L 2251/5338* (2013.01)

(56) References Cited

FOREIGN PATENT DOCUMENTS

| CN | 106887407 A | 6/2017 |
|----|-------------|--------|
| CN | 108281549 A | 7/2018 |
| CN | 108766244 A | 11/2018 |
| CN | 109841734 A | 6/2019 |
| KR | 20180069522 A | 6/2018 |

OTHER PUBLICATIONS

Office Action dated Mar. 17, 2020, issued in counterpart CN Application No. 201910243047.3, with English Translation. (13 pages).
Office Action dated Jul. 16, 2020, issued in counterpart CN Application No. 201910243047.3, with English Translation. (12 pages).
International Search Report dated Jan. 14, 2020, issued in counterpart Application No. PCT/CN2019/109939. (12 pages).
Rejection Decision dated Oct. 9, 2020, issued in counterpart CN Application No. 201910243047.3, with English Translation. (14 pages).

\* cited by examiner

FLEXIBLE DISPLAY PANEL AND FABRICATING METHOD THEREOF, FLEXIBLE DISPLAY APPARATUS

CROSS-REFERENCE TO RELATED APPLICATIONS

This application claims benefit of the filing date of Chinese Patent Application No. 201910243047.3 filed on Mar. 28, 2019, the disclosure of which is hereby incorporated in its entirety by reference.

TECHNICAL FIELD

The disclosure relates to the field of display technology, in particular, to a flexible display panel and fabricating method thereof, and a flexible display apparatus.

BACKGROUND

The organic light-emitting display (OLED) device has the advantages of being self-luminous, fast response, wide viewing angle, high brightness, colorful, thin and light, and is one of the hotspots in the field of display research today. The OLED device has been considered as the next generation display technology. With the development of OLED technology, flexible OLED display devices have been widely studied due to their advantages of being bendable and easy to carry, and have become the main field of development in the display field.

At present, the carrier substrate for the flexible OLED display device may be glass, plastic or stainless steel sheet, etc., wherein plastic and glass are popular for current flexible display devices. In the flexible OLED display technology, separating the flexible substrate from the carrier substrate without damaging the flexible display device is a challenging technology in the flexible OLED display process.

Currently, a flexible OLED display device is prepared by fabricating a flexible substrate and a display device on a carrier substrate. Then, the carrier substrate is removed by laser stripping or resistance heating stripping, or the flexible substrate is separated from the carrier substrate by chemical methods. However, among the above several separation methods, the two methods of laser stripping and resistance heating stripping may generate high temperatures, which may damage the display device. The chemical separation methods may corrode the display device, thereby seriously shortening the lifespan of the display device.

BRIEF SUMMARY

An embodiment of the present disclosure provides a method of fabricating a flexible display panel. The method of fabricating the flexible display panel may include forming a photosensitive layer comprising at least one azo group on a carrier substrate; forming a flexible substrate on the photosensitive layer; irradiating the photosensitive layer with ultraviolet light; and peeling off the flexible substrate from the carrier substrate.

Optionally, the method further comprises forming a barrier layer and a display device sequentially on the flexible substrate before irradiating the photosensitive layer; and peeling off the flexible substrate from the carrier substrate comprises peeling off the flexible substrate, the barrier layer and the display device from the carrier substrate.

Optionally, the photosensitive layer comprising at least one azo group is changed from a trans state to a cis state during irradiation with the ultraviolet light.

Optionally, the photosensitive layer comprising at least one azo group further comprises a phenyl group.

Optionally, the phenyl group further comprises a derivative group, and the derivative group comprises an alkyl group or an aromatic heterocyclic group.

Optionally, irradiating the photosensitive layer comprising at least one azo group with ultraviolet light comprises: irradiating the carrier substrate from a side of the carrier substrate opposite from the photosensitive layer with the ultraviolet light.

Optionally, the ultraviolet light has a wavelength in a range from about 200 nm to about 400 nm.

Optionally, the photosensitive layer comprising at least one azo group is irradiated with the ultraviolet light for a time in a range from about 1 min to about 30 mins.

Optionally, peeling off the flexible substrate from the carrier substrate comprises peeling off the flexible substrate from the carrier substrate by mechanical or physical adsorption.

Optionally, the photosensitive layer comprising at least one azo group has a thickness in a range of from about 10 μm to about 1000 μm.

Optionally, the photosensitive layer comprising at least one azo group is formed on the carrier substrate by a method of dip coating, spray coating, spin coating or pulling or curtain coating.

Optionally, the carrier substrate comprises a glass, a silicon wafer, or a mica sheet.

Optionally, the flexible substrate comprises a polymer, a metal foil or a glass, and the polymer is one or a combination of polyimide, polystyrene, polycarbonate, polyacrylate, polyetherimide, polyethersulfone, polyethylene terephthalate, polyethylene naphthalate or a transparent conductive polyester.

Optionally, the barrier layer comprises $SiO_x$, $SiN_x$, $SiON$, or a combination thereof.

Optionally, the display device comprises a thin film transistor driving element, a basic driving circuit, a light emitting unit, and an encapsulation layer.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
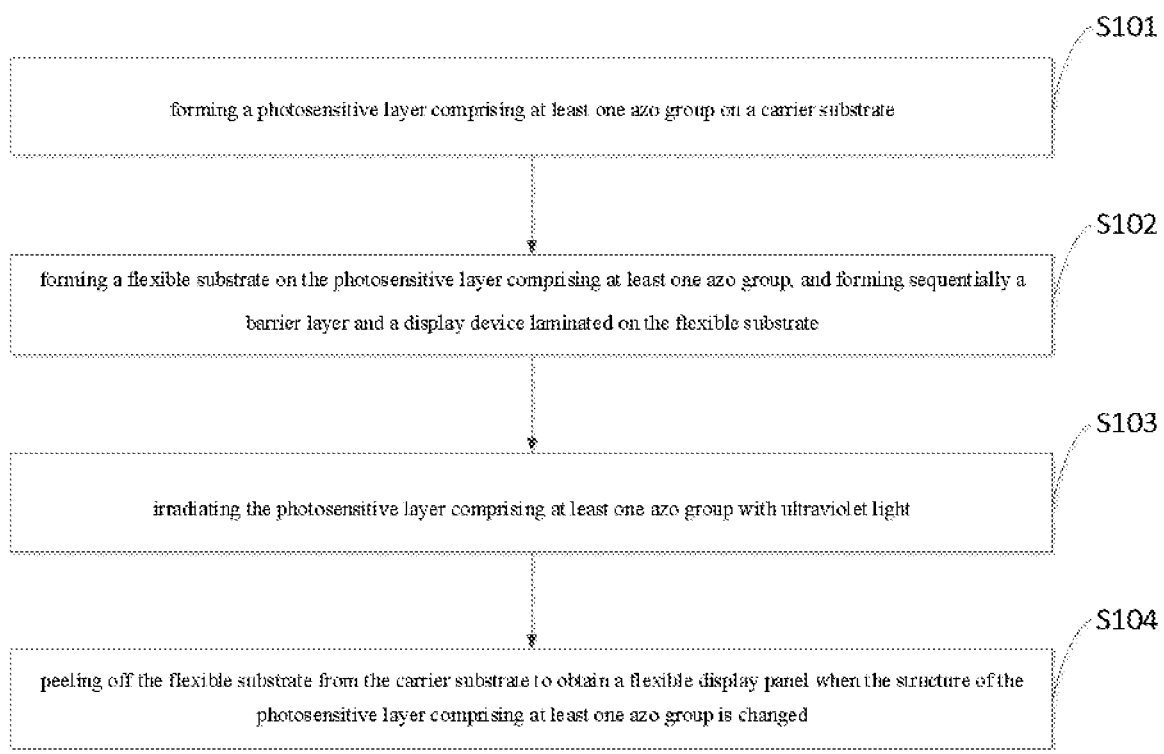
FIG. 1 is a flowchart of a method for fabricating a flexible display panel according to one embodiment of the present disclosure.

The present disclosure will be further described in detail with reference to the accompanying drawings. When referring to the figures, like structures and elements shown throughout are indicated with like reference numerals. Obviously, the described embodiments are only a part of the embodiments of the present disclosure, not all of the embodiments. All other embodiments obtained by a person of ordinary skill in the art based on the embodiments of the present disclosure without creative efforts are within the protection scope of the present disclosure. In the description of the following embodiments, specific features, structures, materials or characteristics may be combined in any suitable manner in any one or more embodiments or examples.

The shapes and sizes of the various components in the drawings do not reflect true proportions, and are merely intended to illustrate the present disclosure.

In the embodiments of the present disclosure, "on" indicates the order of formation of each film layer in the fabrication process of the flexible display panel. For any two layers, the layer formed later is located on the previously formed layer.

The words "including" or "comprising" and the like mean that the element or the item preceding the word includes the element or item listed after the word and its equivalent and do not exclude other components or objects. A numerical value modified by "about" herein means that the numerical value can vary by 10% thereof.

The term "flexible" herein means that the feature defined by the flexible can be defined as largely able to bend without breaking.

Figure 2A:
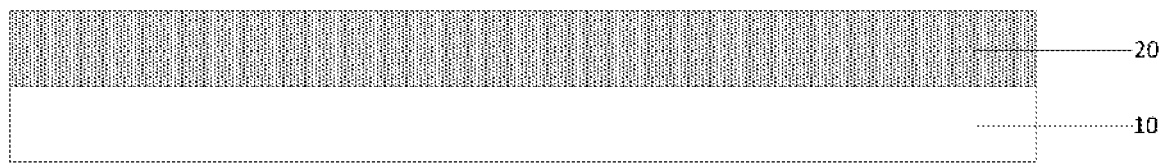
FIGS. 2A to 2D show schematic structural diagrams of a method for fabricating a flexible display panel according to one embodiment of the present disclosure.

A method for fabricating a flexible display panel according to one embodiment of the present disclosure is shown in FIG. 1. The method may include the following steps:

Step S101, as shown in FIG. 2A, includes forming a photosensitive layer 20 comprising at least one azo group on a carrier substrate 10.

In some embodiments, the photosensitive layer 20 comprising at least one azo group exhibits a metastable cis structure under ultraviolet light irradiation and a thermodynamically stable trans structure under visible light irradiation or in a dark room. In this way, initially, the photosensitive layer 20 is formed in a thermodynamically stable trans structure on the carrier substrate. Then, under irradiation of ultraviolet light, the photosensitive layer 20 comprising at least one azo group is transformed into a metastable cis structure, so the adhesion between the photosensitive layer 20 and an object is lowered due to the light contraction effect. Therefore the object can be quickly stripped off from the carrier substrate. The photosensitive layer comprising at least one azo group is a thermodynamically stable trans structure under visible light irradiation or in a dark room, and can adhere firmly to the object due to the van der Waals force. Thus, when the display device is prepared, initially, a photosensitive layer 20 is formed in a thermodynamically stable trans structure to carry the prepared display device. When the flexible substrate is peeled off from the carrier substrate, the photosensitive layer comprising at least one azo group is exposed to ultraviolet light. Then, the thermodynamically stable trans structure of the photosensitive layer is transformed into a metastable cis structure to facilitate stripping off the flexible substrate.

Wherein, the photosensitive layer comprising at least one azo group can be prepared by a method of film coating such as dip coating, spray coating, spin coating, or pull or curtain coating. The photosensitive layer can be patterned or not be patterned.

The material of the carrier substrate is not limited herein. The material of the carrier substrate may be a rigid material. In some embodiments, the material of the carrier substrate may include, but is not limited to, glass, silicon wafer, mica sheet or other rigid carrier material.

Figure 2B:
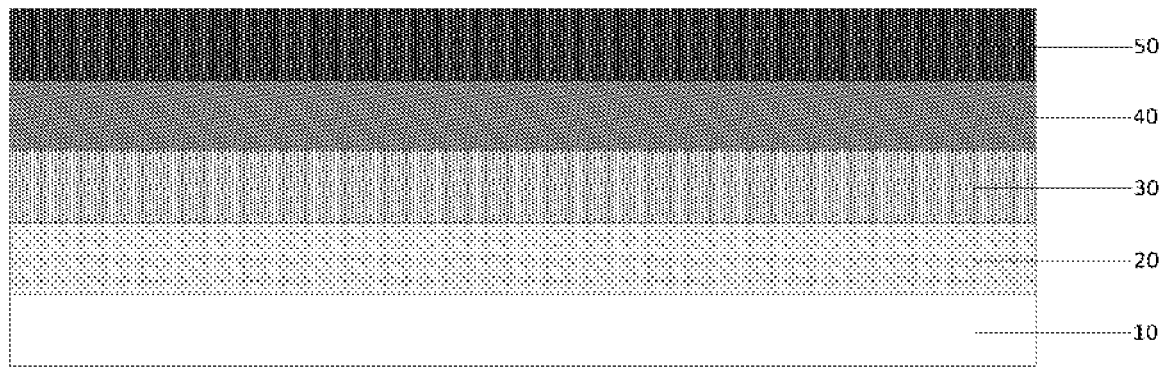

Step S102, as shown in FIG. 2B, includes forming a flexible substrate 30 on the photosensitive layer 20 comprising at least one azo group, and forming sequentially a barrier layer 40 and a display device 50 laminated on the flexible substrate 30.

Wherein, the material of the flexible substrate is not limited. It may be a polymer, a metal foil or an ultra-thin glass, wherein the polymer may include, but not limited to, polyimide (PI), polystyrene(PS), polycarbonate(PC), polyacrylate (PA), polyetherimide (PEI), polyethersulfone(PES), polyethylene terephthalate(PETS), polyethylene naphthalate (PEN) or a transparent conductive polyester.

In some embodiments, the barrier layer 40 may include a dielectric film layer such as $SiO_x$, $SiN_x$, SiON, or a composite film layer thereof.

Those skilled in the art should understand that the display device includes at least a thin film transistor driving element, a basic driving circuit, a light emitting unit (anode, an organic functional layer and an anode), an encapsulation layer, and may also include a color film, a black matrix, etc., which will not be described herein.

Step S103 includes irradiating the photosensitive layer comprising at least one azo group with ultraviolet light.

Figure 2C:
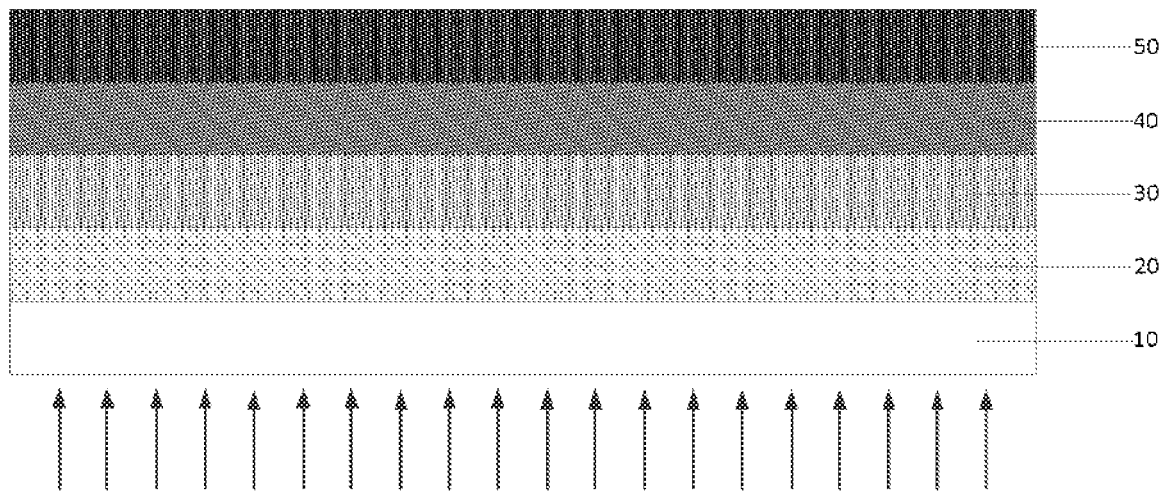

In some embodiments, as shown in FIG. 2C, the carrier substrate 10 on which the flexible substrate 30, the barrier layer 40 and the display device 50 are formed is irradiated with ultraviolet light from the side of the carrier substrate 10 opposite from the photosensitive layer 20. A mercury lamp or a UV-LED lamp group may be used for irradiation.

In this process, under the irradiation of ultraviolet light, the photosensitive layer will gradually transform from a thermodynamically stable trans structure to a metastable cis structure due to the characteristics of the azo group.

Figure 2D:
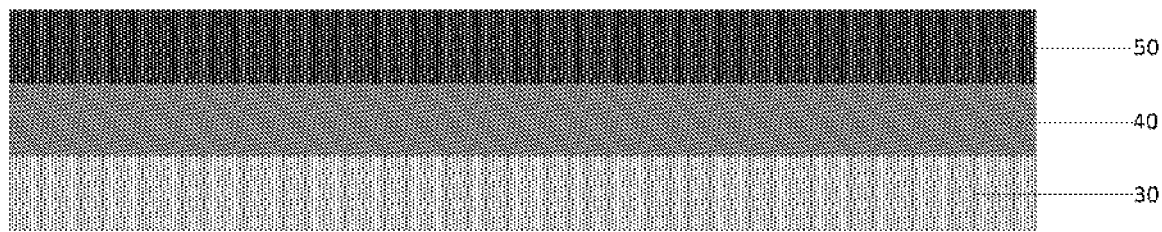

Step S104, as shown in FIG. 2D, includes peeling off the flexible substrate 30 from the carrier substrate 10 to obtain a flexible display panel when the structure of the photosensitive layer 20 comprising at least one azo group is changed. In some embodiments, when the photosensitive layer 20 comprising at least one azo group is transformed from a thermodynamically stable trans structure to a metastable cis structure, the flexible substrate 30 can be peeled off from the carrier substrate 10, and the carrier substrate 10 and the photosensitive layer 20 can be peeled off from the flexible substrate 30 together.

Specifically, under ultraviolet light irradiation, the photosensitive layer 20 comprising at least one azo group is transformed into a metastable cis structure, such that the adhesion between the photosensitive layer 20 comprising at least one azo group and the flexible substrate 30 and the adhesion between the photosensitive layer 20 and the carrier substrate 10 are reduced due to the light contraction effect. However, since the carrier substrate 10 is generally a glass substrate, which is hydrophilic, and the flexible substrate 30 is generally PI, which is hydrophobic, while the photosensitive layer 20 comprising at least one azo group is also hydrophilic, according to the principle of similar compatibility, the adhesion between the carrier substrate 10 and the photosensitive layer 20 comprising at least one azo group is stronger compared to the adhesion between the flexible substrate 30 and the photosensitive layer 20 comprising at least one azo group. Therefore, even if the adhesion between the photosensitive layer 20 comprising at least one azo group and the flexible substrate 30 and the adhesion between the photosensitive layer 20 comprising at least one azo group and the carrier substrate 10 are both lowered, the adhesion between the carrier substrate 10 and the photosensitive layer 20 comprising at least one azo group is still much stronger than the adhesion between the flexible substrate 30 and the photosensitive layer 20 comprising at least one azo group. As a result, when the flexible substrate 30 is peeled off from the carrier substrate 10 by mechanical or physical adsorption, the carrier substrate 10 can be peeled off together with the photosensitive layer 20 from the flexible substrate 30.

In the fabrication method of the flexible display panel provided by one embodiment of the present disclosure, the photosensitive layer comprising at least one azo group is thermodynamically stable in the visible light irradiation or in the dark room, and thus can adhere firmly to the object due to the van der Waals force. The photosensitive layer comprising at least one azo group exhibits a metastable cis structure under ultraviolet light irradiation, and the adhesion between the photosensitive layer and the object is lowered due to the light contraction effect. As a result, the photosensitive layer can be quickly separated from the surface of the object. Some embodiments of the present disclosure comprise forming the above-mentioned photosensitive layer comprising at least one azo group on a carrier substrate, then forming a flexible substrate, a barrier layer and a display device on the photosensitive layer. When the photosensitive layer comprising at least one azo group is irradiated with ultraviolet light, the photosensitive layer comprising at least one azo group is converted from a thermodynamically stable trans structure to a metastable cis structure. That is, the adhesion between the photosensitive layer and the flexible substrate is lowered due to light contraction effect during ultraviolet light irradiation. In this way, peeling of the flexible substrate from the carrier substrate can be easily achieved without damaging the display device. The fabrication method of the flexible display panel provided by some embodiments of the present disclosure does not damage the display device in the preparation process, and the manufacturing process and the separation process are simple and the cost is low.

In some embodiments, the present disclosure can achieve a non-destructive peeling of a flexible substrate by using a material comprising at least one azo group as a photosensitive layer and by transforming the at least one azo group from a trans structure to a cis structure under irradiation of ultraviolet light. Therefore, the problem that the laser energy is high so as to likely cause the display device to be defective in the related art can be solved. Furthermore, when peeling off the flexible substrate, the carrier substrate and the photosensitive layer can be peeled off together from the flexible substrate, so that no residue of the photosensitive layer remains on the flexible substrate. Therefore, the photosensitive layer does not affect the performance of the display device. In this way, it can solve the problem of an ordinary photosensitive adhesive, which tends to leave residual glue on the carrier substrate during the stripping process and cause the side of the flexible substrate opposite from the display device to be uneven, and accordingly affect the performance of the display device. At the same time, under the ultraviolet light irradiation, because the at least one azo group undergoes a reversible structural change, the required energy of the ultraviolet light is small. As such, the response time is fast, and the efficiency of peeling off the flexible substrate can be greatly improved.

Further, in some embodiments, in order to further improve the high temperature resistance, the material of the photosensitive layer comprising at least one azo group may further include a phenyl group. Since the phenyl group-containing material has better high temperature resistance, using a phenyl group to replace other groups on the nitrogen on the photosensitive layer comprising at least one azo group can further improve the resistance to high temperatures, thereby keeping from being damaged in the subsequent preparation process.

Figure 3:
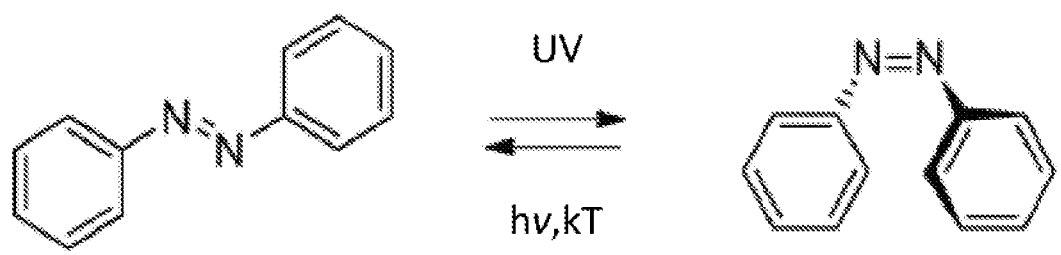
FIG. 3 is a schematic diagram showing transition of a trans structure to a cis structure of an azobenzene group according to one embodiment of the present disclosure.

It should be noted that the azobenzene group has thermodynamically stable trans and trans-stable cis isomers. In one embodiment, as shown in FIG. 3, under ultraviolet (UV) irradiation, the azobenzene group transforms from trans (left) to cis (right) (trans→cis), while under visible light irradiation at specific wavelengths (hv) or in the dark room (KT), the cis (right) structure of the thermodynamic metastable state can be transformed into the trans (left) state (cis→trans). The entire heterogeneous phase transformation process is reversible. Since the cis and trans states of the azobenzene group have different dipole moments and molecular sizes (trans: 0.5 D/0.9 nm; cis: 3.1 D/0.55 mu), thus under different irradiation conditions, the reversible cis-trans isomerization of the azobenzene group can cause the polymer matrix to have a photosoftening effect, a light expansion/contraction effect, a photocuring effect, and/or a photofluidization effect.

Further, in a specific implementation of the above fabrication method provided by one embodiment of the present disclosure, the phenyl group may further include a derivative group. In some embodiments, the derivative group may include an alkyl group or an aromatic heterocyclic group, which will not be exemplified herein.

Figure 4:
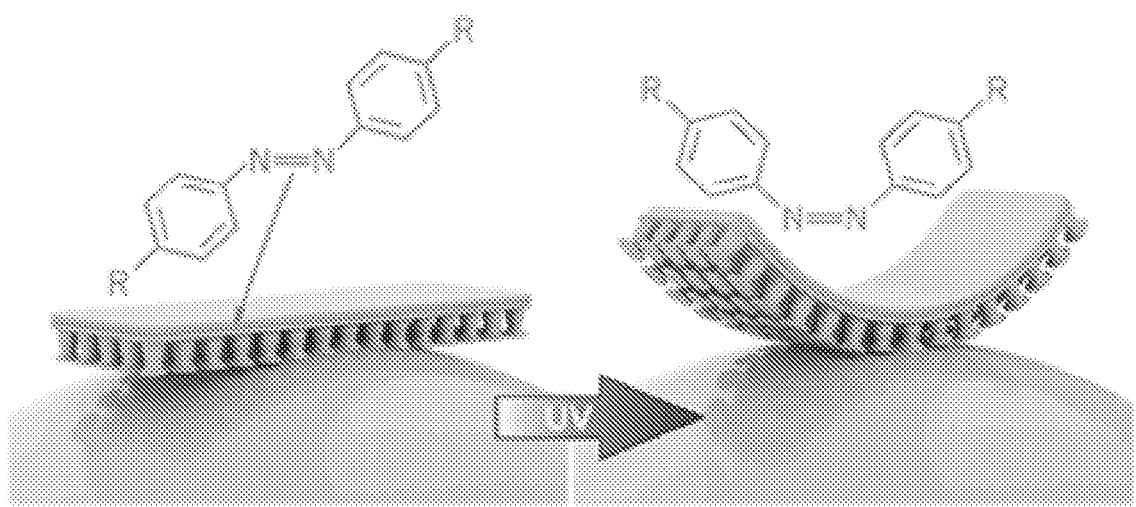
FIG. 4 is a physical illustration of structural transformation of a photosensitive layer comprising at least one azo group under ultraviolet light irradiation according to one embodiment of the present disclosure.

FIG. 4 is a physical illustration of a structural transformation of a photosensitive layer comprising at least one azo group under ultraviolet light irradiation according to one embodiment of the present disclosure. In the ultraviolet (UV) irradiation process, the adhesion between the photosensitive layer and the flexible substrate is lowered due to the light contraction effect, and the flexible substrate can be easily peeled off from the carrier substrate without destroying the display device. Furthermore, by adjusting the functional group R on the phenyl group, the response time to the irradiation for a specific ultraviolet light wavelength can be adjusted. Thus, the efficiency of peeling off the flexible substrate can be greatly improved.

Further, in a specific implementation of the above fabrication method provided by one embodiment of the present disclosure, peeling off the flexible substrate from the carrier substrate may r include:

Peeling off the flexible substrate from the carrier substrate by mechanical or physical adsorption.

Further, in a specific implementation of the above fabrication method provided by one embodiment of the present disclosure, the ultraviolet light wavelength may be about 200 nm to about 400 nm, and the time of ultraviolet light irradiation may be about 1 minute to about 30 minutes.

Further, in a specific implementation, if the thickness of the photosensitive layer comprising at least one azo group is too thin or too thick, the peeling of the flexible substrate is unfavorable. In the above preparation method provided by one embodiment of the present disclosure, the photosensitive layer comprising at least one azo group can have a thickness of about 10 um to about 1000 um.

Further, in a specific implementation of the above fabrication method provided by one embodiment of the present disclosure, forming a photosensitive layer comprising at least one azo group on the carrier substrate may include:

Forming a photosensitive layer comprising at least one azo group on the carrier substrate by a coating or sputtering method.

Based on the same inventive concept, one embodiment of the present disclosure further provides a flexible display panel. As shown in FIG. 2D, a flexible display panel can be provided by the method for fabricating the flexible display panel. The beneficial effects of the flexible display panel are the same as the method and will not be described herein.

Based on the same inventive concept, one embodiment of the present disclosure further provides a display apparatus, including the flexible display panel according to one embodiment of the present disclosure. Since the principle of solving the problem of the display apparatus is similar to the principle of the foregoing flexible display panel, the implementation of the display apparatus can be referred to the implementation of the foregoing flexible display panel, and the detailed description thereof will not be repeated herein. The beneficial effects of the display apparatus are the same as the method and will not be described here.

In a specific implementation, the foregoing display apparatus provided by one embodiment of the present disclosure may be any product or component having a display function, such as a tablet computer, a television, a display device, a notebook computer, a digital photo frame, a navigator, etc. Other indispensable components of the display apparatus are understood by those skilled in the art, and are not described herein, nor should they be construed as limiting the present disclosure.

It is apparent that those skilled in the art can make various modifications and variations to the present disclosure without departing from the spirit and scope of the disclosure. Thus, it is intended that the present disclosure covers the modifications and variations.

What is claimed is:

1. A method of fabricating a flexible display panel, comprising:
   forming a photosensitive layer comprising at least one azo group on a carrier substrate;
   forming a flexible substrate on the photosensitive layer;
   forming a barrier layer and a display device sequentially on the flexible substrate;
   irradiating the photosensitive layer with ultraviolet light; and
   peeling off the flexible substrate from the carrier substrate;
   wherein the flexible substrate is directly formed on the photosensitive layer;
   the barrier layer is formed between the flexible substrate layer and the display device; and
   the photosensitive layer comprising the at least one azo group further comprises a phenyl group, the phenyl group further comprises a derivative group, and the derivative group comprises an alkyl group or an aromatic heterocyclic group.

2. The method according to claim 1, wherein peeling off the flexible substrate from the carrier substrate comprises peeling off the flexible substrate, the barrier layer and the display device from the carrier substrate.

3. The method according to claim 2, wherein the photosensitive layer comprising at least one azo group is changed from a trans state to a cis state during irradiation with the ultraviolet light.

4. The method according to claim 1, wherein irradiating the photosensitive layer with ultraviolet light comprises: irradiating the carrier substrate from a side of the carrier substrate opposite from the photosensitive layer with the ultraviolet light.

5. The method according to claim 1, wherein the ultraviolet light has a wavelength in a range from about 200 nm to about 400 nm.

6. The method according to claim 1, wherein the photosensitive layer comprising at least one azo group is irradiated with the ultraviolet light for a time in a range from about 1 min to about 30 mins.

7. The method according to claim 1, wherein peeling off the flexible substrate from the carrier substrate comprises:
   peeling off the flexible substrate from the carrier substrate by mechanical or physical adsorption.

8. The method according to claim 1, wherein the photosensitive layer comprising at least one azo group has a thickness in a range of from about 10 μm to about 1000 μm.

9. The method according to claim 1, wherein the photosensitive layer comprising at least one azo group is formed on the carrier substrate by a method of dip coating, spray coating, spin coating or pulling or curtain coating.

10. The method according to claim 1, wherein the carrier substrate comprises a glass, a silicon wafer, or a mica sheet.

11. The method according to claim 1, wherein the flexible substrate comprises a polymer, a metal foil or a glass, and the polymer is one or a combination of polyimide, polystyrene, polycarbonate, polyacrylate, polyetherimide, polyethersulfone, polyethylene terephthalate, polyethylene naphthalate or a transparent conductive polyester.

12. The method according to claim 1, wherein the barrier layer comprises SiOx, SiNx, SiON, or a combination thereof.

13. The method according to claim 1, wherein the display device comprises a thin film transistor driving element, a basic driving circuit, a light emitting unit, and an encapsulation layer.

* * * * *